United States Patent
Liao et al.

(10) Patent No.: US 6,530,797 B2
(45) Date of Patent: Mar. 11, 2003

(54) ZIF SOCKET

(75) Inventors: Bono Liao, Taichung (TW); Ainge Liou, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/854,025

(22) Filed: May 10, 2001

(65) Prior Publication Data

US 2002/0146925 A1 Oct. 10, 2002

(30) Foreign Application Priority Data

Apr. 10, 2001 (TW) .................................. 90205545 U

(51) Int. Cl.⁷ ................................................ H01R 4/50
(52) U.S. Cl. ........................................ 439/342; 439/259
(58) Field of Search ........................ 439/259, 263–266, 439/342, 268, 269

(56) References Cited

U.S. PATENT DOCUMENTS 4,750,891 A * 6/1988 Egawa ........................ 439/259
5,057,031 A * 10/1991 Sinclair ...................... 439/261
5,489,218 A * 2/1996 McHugh ..................... 439/342
5,569,045 A * 10/1996 Hsu ............................ 439/342
5,679,020 A * 10/1997 Lai et al. .................... 439/342

* cited by examiner

Primary Examiner—Hien Vu
(74) Attorney, Agent, or Firm—Wei Te Chung

(57) ABSTRACT

A ZIF socket (1) comprises a base (2), a sliding cover (3) and an actuating rod (4). The base includes a mounting portion (22) with a lower receiving channel (221) in a rear end thereof. The sliding cover is assembled on the base and comprises a tailboard (32) with an upper receiving channel (322) in a rear end thereof. The actuating rod includes a handle (41) and a driving arm (42) extending perpendicularly from an end of the handle. The driving arm is received in the lower receiving channel and the upper receiving channel and is rotatable to drive the sliding cover to move longitudinally along the base. The handle has a straight rod (411) and a grasping arm (412) parallel to the straight rod with an upswept distance. The grasp arm includes a remainder portion (413) with removal of a lower portion thereof to afford large space for handling.

2 Claims, 3 Drawing Sheets

＃ ZIF SOCKET

BACKGROUND OF THE INVENTION

1. Field of the Invention

The present invention relates to a ZIF socket, and particularly to a ZIF socket having enough space for manipulating an actuating rod thereof.

2. Description of Related Art

Conventionally, a low-profile ZIF socket receiving an integrated circuit (IC) chip has small space for handling. Referring to FIG. 3 and FIG. 4, a conventional ZIF socket 5 includes a base 6, a sliding cover 7 and an actuating rod 7. The base 6 comprises a plurality of through holes 60 for receiving corresponding contacts 50, a lower receiving channel 61 and a concavity 62 in front of the lower receiving channel 61. The sliding cover 7 is assembled on the base 6 and comprises a plurality of receiving holes 70 for receiving corresponding pins of an integrated circuit chip 52. The sliding cover 7 includes a tailboard 71 in a rear end thereof. The tailboard 71 comprises a mounting section 74 and a second transverse receiving channel 73 in a middle of the mounting section 74. The actuating rod 8 is substantially an L-shaped rod and comprises a straight handle 80 and a driving arm 81 perpendicular to the handle 80. The driving arm 81 is retained in the lower receiving channel 61 by the mounting section 74 and includes a curved arm 82 extending forwardly in a middle thereof. The curved arm 82 is received in the concavity 62 of the base 6 and drives the sliding cover 7 to move longitudinally along the base 6. When the handle 80 moves between a closed position and an open position, the curved arm 82 rotates in the concavity 62 and drives the sliding cover 7 to move longitudinally along the base 6 thereby moving the pins of the chip 9 to electrically connect with the contacts 50.

However, when the handle 80 is in the closed position, i.e., in a horizontal position, a distance between the handle 80 and a mating printed circuit board 51 is too small to hold and the ZIF socket 5 is inconvenient to handle.

Hence, an improved ZIF socket with enough space for handling is required to overcome the disadvantages of the conventional ZIF socket.

SUMMARY OF THE INVENTION

Accordingly, the object of the present invention is to provide a ZIF socket with enough space for handling.

In order to achieve the object set forth, a ZIF socket with a plurality of contacts comprises a base, a sliding cover and an actuating rod. The base includes a baseboard and a mounting portion in a rear end thereof. The baseboard comprises a plurality of through holes for receiving the contacts. The mounting portion comprises a first transverse receiving channel. The sliding cover is assembled on the base and comprises a cover board and a tailboard in a rear end thereof. The cover board includes a pair of side walls extending from each transverse edge thereof. The tailboard comprises a second transverse receiving channel in middle thereof. The actuating rod includes a handle and a driving arm extending perpendicularly from an end of the handle. The driving arm comprises a pair of coaxial pivots received in the receiving channel and a curved arm extending forwardly between the pivots. The curved arm is received in the upper receiving channel and rotates to drive the sliding cover to move longitudinally along the base. The handle has a straight rod and a grasping arm parallel to the straight rod with an upswept distance. The grasp arm includes a remainder portion with removal of a lower portion thereof to afford large space for handling.

Other objects, advantages and novel features of the invention will become more apparent from the following detailed description when taken in conjunction with the accompanying drawings.

DETAILED DESCRIPTION OF THE INVENTION

Figure 1:
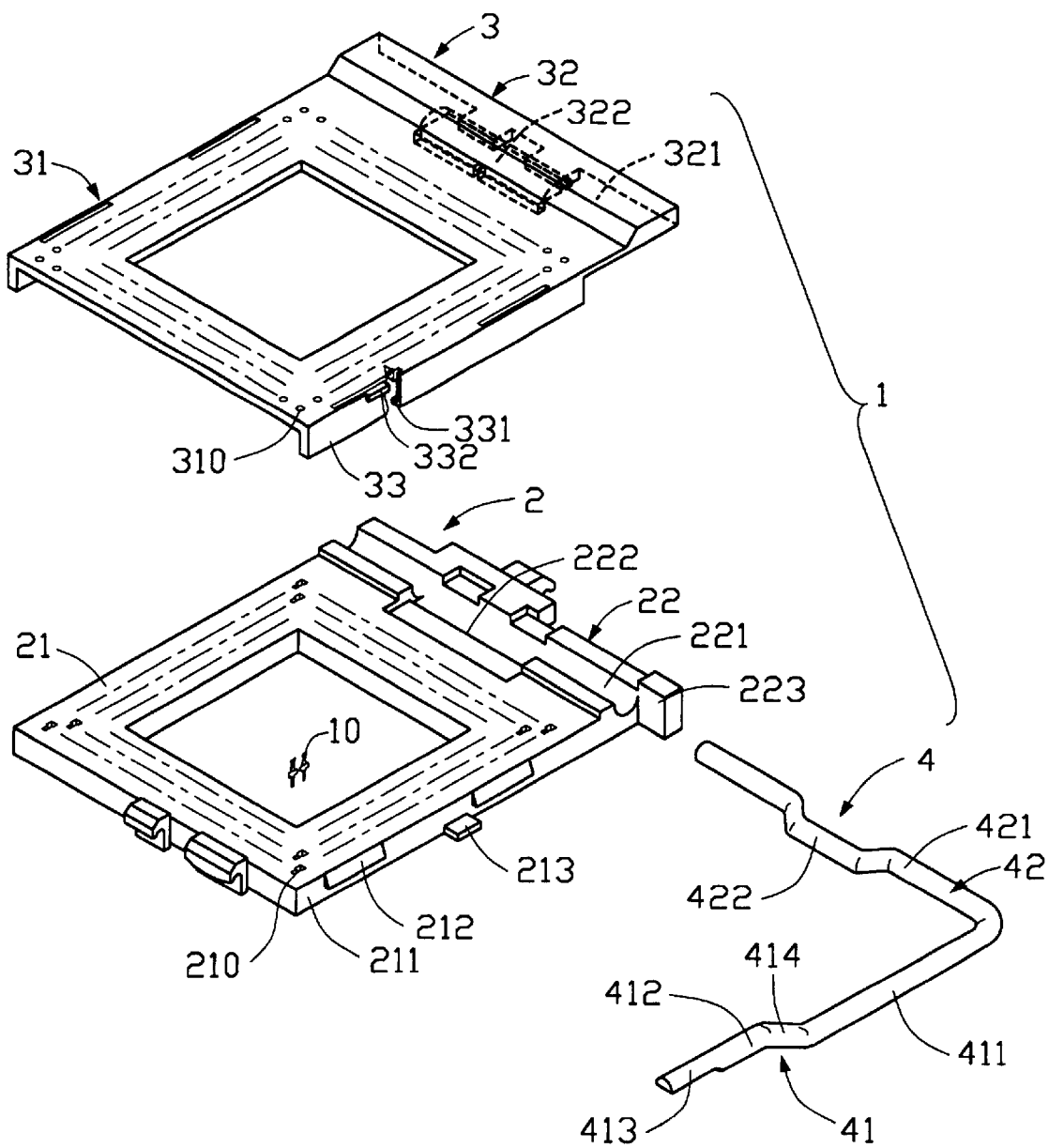
FIG. 1 is an exploded perspective view of a ZIF socket in accordance with the present invention.

Reference will now be made to the drawing figures b describe the present invention in detail.

Referring to FIG. 1, a ZIF socket 1 of the present invention comprises a base 2, a sliding cover 3 and an actuating rod 4.

The base 2 includes a rectangle baseboard 21 and a mounting portion 22 in a rear end thereof. The baseboard 21 comprises a plurality of through holes 210 for receiving contacts 10 of the ZIF socket 1. The baseboard 21 also includes a pair of blocks 212 extending outwardly from a top of each side wall 211 thereof and an underlay 213 extending outwardly from a bottom of a right side wall 211. The mounting portion 22 includes a first transverse receiving channel 221 and a concavity 222 in front of the receiving channels 221. A block 223 extends outwardly from a rear and right end of the mounting portion 22 and prevents the actuating rod 4 moving unduly in an open position.

The sliding cover 3 comprises a rectangle cover board 31 and a tailboard 32 at a rear end thereof. The cover board 31 includes a plurality of receiving holes 310 respectively corresponding to the through holes 210 for receiving corresponding pins of a mating integrated circuit chip 12. A pair of side walls 33 extends downwardly from each transverse edge of the cover board 31 and engages with the baseboard 21 to prevent the sliding cover 3 from moving transversely on the base 2. The side wall 33 comprises a pair of protrusions 331 extending inwardly from a bottom thereof for respectively engaging with the blocks 212 of the base 2 thereby securing the sliding cover 2 on the base 2. A rim 332 extends outwardly from a top of a right side wall 33. The tailboard 32 includes a mounting section 321, and a second transverse receiving channel 322 in a middle of the mounting section 321.

The actuating rod 4 is substantially an L-shaped rod and includes a handle 41 and a driving arm 42 extending perpendicularly from an end of the handle 41. The driving arm 42 comprises a pair of coaxial pivots 421 received in the lower receiving channel 221 and a curved arm 422 extending forwardly between the pivots 421. The handle 41 includes a straight rod 411. A slanting arm 414 extends slantways upward from a free end of the straight rod 411 and a grasping arm 412 extending parallel to the straight rod 411 from a freeend of the slanting arm 414. The grasping arm 412 is removed a lower portion thereof thereby forming a remainder portion 413. The thickness of the remainder portion 413 is not less than one-third of the diameter of the grasping arm 412 to have enough strength or rigidity for resisting distortion or disjunction.

In assembly, after the driving arm 42 is put in the first transverse receiving channel 221, the sliding cover 3 is placed on the base 2 and then pushed down to engage the sliding cover 3. A lower edge of the side wall 33 distorts outwardly along the blocks 212 of the base 2 and the protrusions 331 respectively engages with the blocks 212 thereby securing the sliding cover 3 on the base 2 in vertical and transverse directions. In addition, the tailboard 32 engages with the mounting portion 22 thereby retaining the pivot 421 in the receiving channel 221. The actuating rod 4 can pivotably rotate in the concavity 222 about the axis of the pivot 421 and drive the sliding cover 3 to move longitudinally on the base 2 thereby moving pins of a corresponding chip 12 to electrically mate with the contacts 10.

Figure 2:
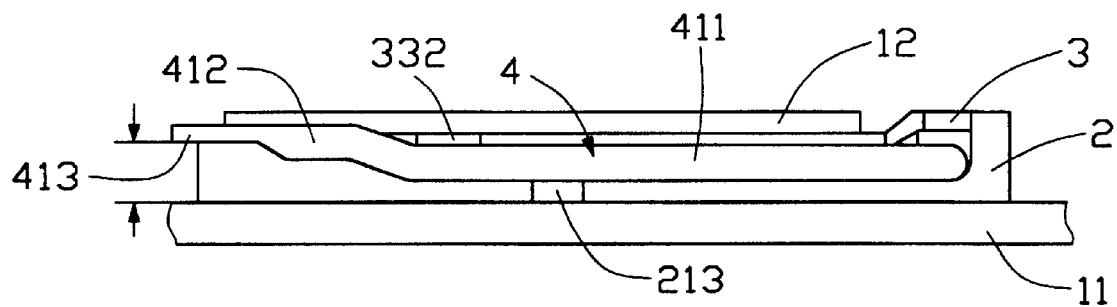
FIG. 2 is a front assembled view of the ZIF socket in FIG. 1 with a mating chip and a corresponding printed circuit board.
Figure 4:
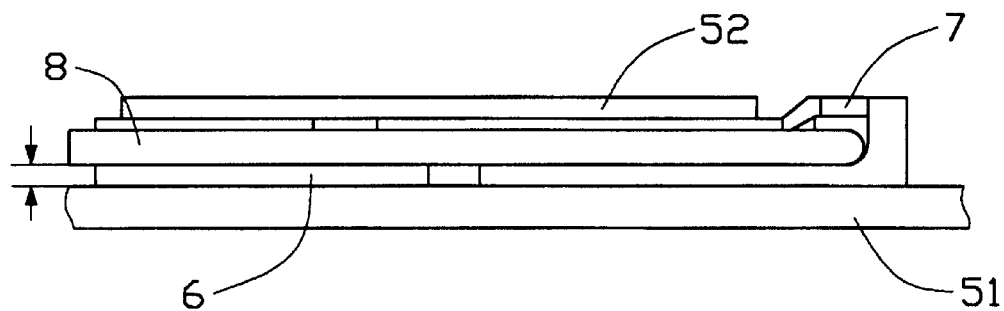
FIG. 4 is a front assembled view of the ZIF socket in FIG. 3 with a mating chip and a corresponding printed circuit board.
Figure 3:
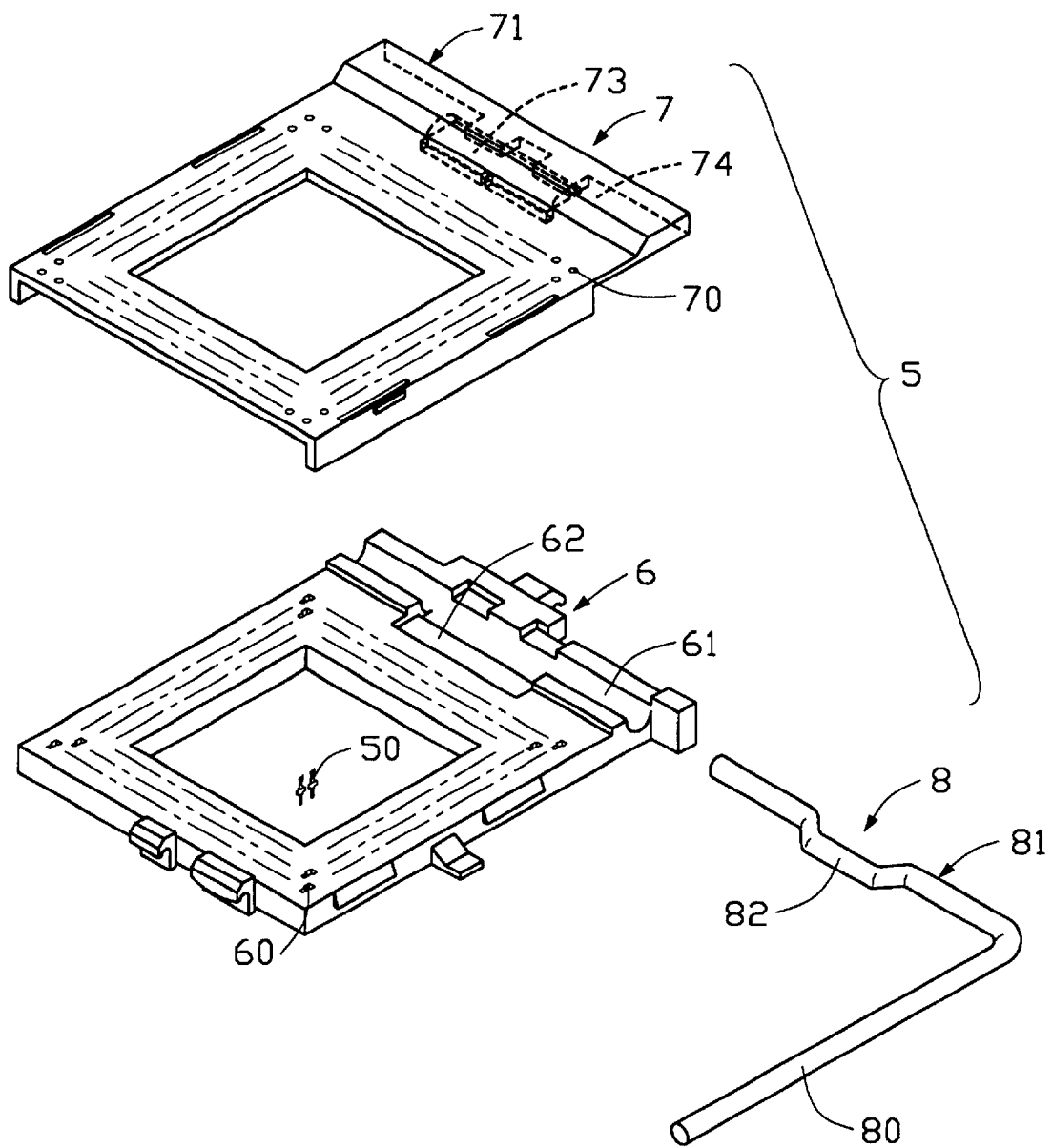
FIG. 3 is an exploded perspective view of a prior art ZIF socket.

Referring to FIG. 2, when the handle 4 is in closed position, the handle 4 is secured in the horizontal position by the underlay 213 of the base 2 and the rim 332 of the sliding cover 3. A first vertical distance h1 between the straight rod 411 and a corresponding printed circuit board 11 is smaller than a second vertical distance h2 between the grasping arm 412 and the printed circuit board 11. A vertical distance h3 between the remainder portion 413 and the printed circuit board 11 is larger than the second distance h2. Since the grasping arm 412 slants upwardly from the straight rod 411 and the remainder portion 413 is formed by removal of the lower portion of the grasping arm 412, the third vertical distance h3 is larger than the first and second vertical distances h1, h2. In addition, the thickness of the remainder portion 413 is no less than one-third of the diameter of the grasping arm 412, therefore, the remainder portion 413 has enough strength or rigidity to resist distortion or disjunction in handling.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ZIF socket with a plurality of contacts comprising:
   a base including a baseboard and a mounting portion at a rear end thereof, the baseboard comprising a plurality of though holes for receiving the contacts, the mounting portion comprising a first transverse receiving channel;
   a sliding cover being assembled on the base and comprising a cover board and a tailboard at a rear end thereof, the cover board including a pair of side walls extending from a transverse edge thereof, the tail board comprising a second transverse receiving channel; and
   an actuating rod having a circular cross section and including a handle and a driving arm extending perpendicular to the handle, the driving arm comprising a pair of coaxial pivots received in the first transverse receiving channel and a curved arm extending between the pivots, the curved arm being received in the second transverse receiving channel and movable to drive the sliding cover to move longitudinally along the base, the handle having a straight rod and a grasping arm parallel to the straight rod with an upswept distance, the grasping arm including a remainder portion at an end thereof distance from the straight rod and an other portion left thereof, the reminder portion being parallel to and thinner than other portion of the other end of the grasping arm, the grasping arm having a bottom surface with a step extending from the remainder portion to the other portion; wherein
   the handle includes a slanting arm extending slantways upward from an end of the straight rod and positioned in between the grasping arm and the straight rod, and the grasping arm extending from a free end of the slanting arm; wherein
   the thickness of reminder potion is no less than one-third of the diameter of the grasping arm.

2. The ZIF socket as described in claim 1, wherein the mounting portion includes a block extending outwardly from an end thereof for retaining the actuating rod in an open position.

\* \* \* \* \*